United States Patent
Gao et al.

(10) Patent No.: US 7,633,292 B2
(45) Date of Patent: Dec. 15, 2009

(54) METHOD OF REDUCING EDDY CURRENTS CAUSED BY A GRADIENT MAGNETIC FIELD IN A MAGNETIC RESONANCE SYSTEM

(75) Inventors: Jing Gao, Shenzhen (CN); Cheng Ni, Shenzhen (CN); Zhong You Ren, Shenzhen (CN); Chao Wang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 100 days.

(21) Appl. No.: 12/039,099

(22) Filed: Feb. 28, 2008

(65) Prior Publication Data

US 2008/0204024 A1    Aug. 28, 2008

(30) Foreign Application Priority Data

Feb. 28, 2007    (CN) .................. 2007 1 0064087

(51) Int. Cl.
    G01V 3/00    (2006.01)
(52) U.S. Cl. ...................... 324/309; 324/318
(58) Field of Classification Search ......... 324/300–322; 600/410–435
    See application file for complete search history.

(56) References Cited

U.S. PATENT DOCUMENTS

| | | | | |
|---|---|---|---|---|
| 4,733,189 A | * | 3/1988 | Punchard et al. | 324/318 |
| 5,488,299 A | * | 1/1996 | Kondo et al. | 324/318 |
| 5,770,943 A | * | 6/1998 | Zhou | 324/307 |
| 6,178,353 B1 | * | 1/2001 | Griffith et al. | 607/61 |
| 6,335,620 B1 | * | 1/2002 | Weissenberger | 324/307 |
| 6,531,870 B2 | * | 3/2003 | Heid et al. | 324/318 |
| 7,514,928 B2 | * | 4/2009 | Westphal | 324/319 |
| 2007/0255132 A1 | * | 11/2007 | Shalgi et al. | 600/424 |

FOREIGN PATENT DOCUMENTS

| | | | | |
|---|---|---|---|---|
| DE | 4139420 A | * | 6/1992 | |
| JP | 09074777 A | * | 3/1997 | |
| JP | 2002052003 | * | 2/2002 | |

* cited by examiner

*Primary Examiner*—Brij B Shrivastav
*Assistant Examiner*—Dixomara Vargas
(74) *Attorney, Agent, or Firm*—Schiff Hardin LLP

(57) ABSTRACT

A method for reducing eddy currents caused by the gradient magnetic field in a magnetic resonance system employs an anti-eddy current device formed by a number of laminated metallic plates, and includes the steps of calculating the distribution of the main magnetic field of the magnetic resonance system in the anti-eddy current device, calculating the distribution of the main magnetic field and the gradient magnetic field in the anti-eddy current device, subtracting the calculated distribution of the main magnetic field in the anti-eddy current device from the calculated distribution of the main magnetic field and the gradient magnetic field in the anti-eddy current device, to obtain the distribution of the gradient magnetic field in the anti-eddy current device, and adjusting the setting of the metallic plates of the anti-eddy current device based on the distribution of the gradient magnetic field in the anti-eddy current device, so as to reduce the eddy current. The adjustment in the metallic plates of the anti-eddy current device should be such that the gradient magnetic field is parallel to or substantially parallel to the plane of the metallic plates. The metallic plates can be further divided into a number of areas, or the laminating direction of the metallic plates in different areas can be adjusted according to the specific distribution of the gradient magnetic field to obtain the optimum effect of eddy current reduction.

5 Claims, 3 Drawing Sheets

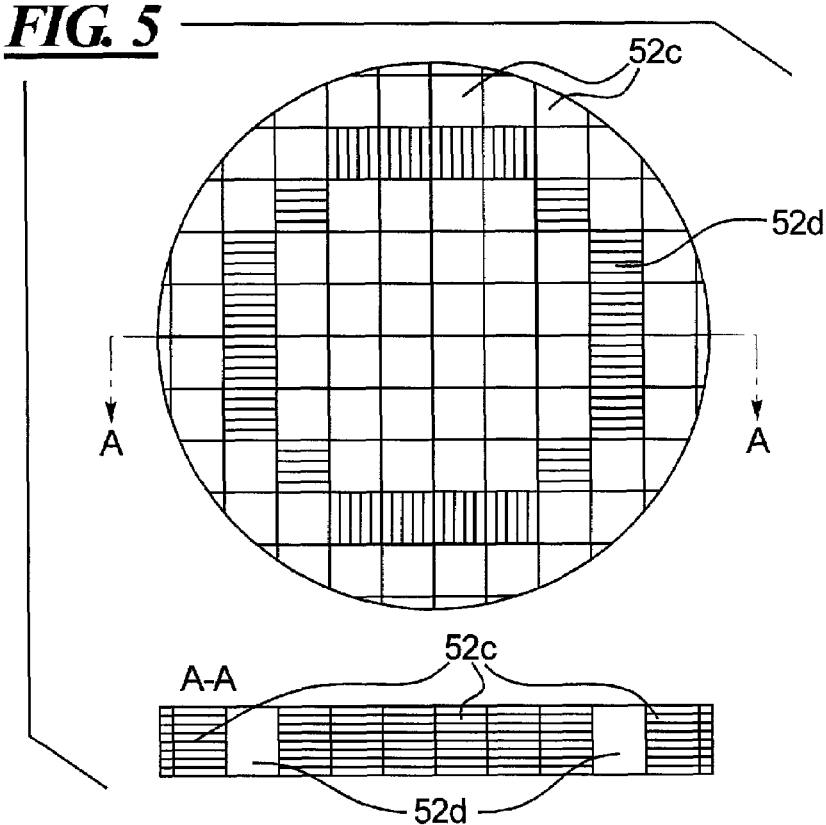
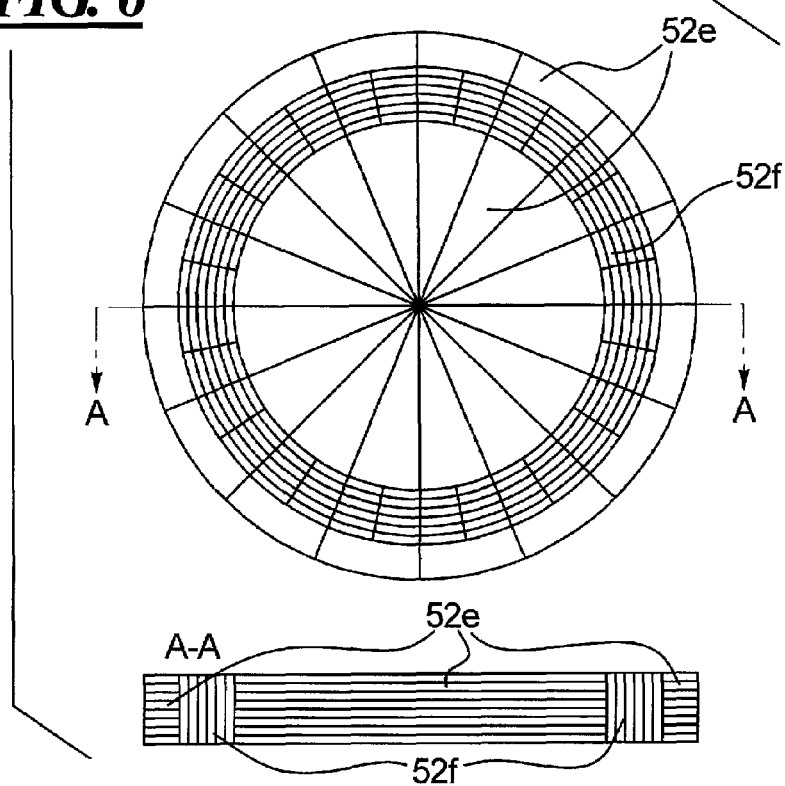

METHOD OF REDUCING EDDY CURRENTS CAUSED BY A GRADIENT MAGNETIC FIELD IN A MAGNETIC RESONANCE SYSTEM

BACKGROUND OF THE INVENTION

1. Field of the Invention

The present invention presents a method for reducing eddy currents in a magnetic resonance system, especially a method for reducing eddy currents caused by the gradient magnetic field used in an open magnetic resonance system.

2. Description of the Prior Art

A common open magnetic resonance system (Open MRI) typically has a yoke, pole plates, a magnet (permanent magnet or superconducting magnet), an anti-eddy current device and a Rose ring. Referring to FIG. 1 and using a common open MRI as an example, magnet 20 is set between pole plates 10 and 30 to generate a main magnetic field. Rose ring 40 is set under the pole plate 30 for shimming. The gradient coil 60 is provided in the magnetic resonance system to generate a gradient magnetic field. Anti-eddy current device 50 is set between the pole plate 30 and the gradient coil 60 to reduce the eddy current caused by the gradient magnetic field.

With the continuous development of MRI pulse sequence, the requirements on gradient amplitude and slew rate of the gradient magnetic field are increasingly demanding, which results in stronger eddy currents. These eddy currents not only increase the ramping time of the gradient magnetic field, but also tremendously affect the homogeneity of the main magnetic field and ultimately result in decreased quality of the magnetic resonance images.

U.S. Pat. No. 5,283,544, Chinese Patent Applications No. 01245762.0 and No. 94222373.X separately propose an anti-eddy current device for use in a magnetic resonance system to reduce eddy currents wherein the eddy currents are reduced by optimizing the structure of the anti-eddy current device to shorten the path of the eddy currents. Chinese Patent Application No. 99118614.1 proposes another anti-eddy current device made of a non-crystal material, which has a higher resistance and is much thinner compared with the silicon steel laminations adopted in the conventional anti-eddy current devices, and can effectively reduce the eddy current.

These two anti-eddy current devices can be used in combination to achieve a better reduction of the eddy current.

However, these anti-eddy current devices are only improved in terms of their own structures or materials without taking into account how the magnetic field of the anti-eddy current devices is distributed in a specific working environment, which does not permit these anti-current devices to achieve the expected effects or to be made full use of in actual operation.

SUMMARY OF THE INVENTION

An object of the present invention is to provide a method for reducing eddy currents caused by the gradient magnetic field in a magnetic resonance apparatus wherein the setting of the metallic laminations of the anti-eddy current device is adjusted based on the distribution of the gradient magnetic field in the magnetic resonance system to achieve a better eddy current reduction.

The above object is achieved in accordance with the present invention by a method of reducing eddy currents caused by the gradient magnetic field in a magnetic resonance system by using an anti-eddy current device formed by a number of metallic plates (laminations), and the method includes the following steps of calculating the distribution of the main magnetic field of the magnetic resonance system in the anti-eddy current device, calculating the distribution of the main magnetic field and the gradient magnetic field in the anti-eddy current device, subtracting the calculated distribution of the main magnetic field in the anti-eddy current device from the calculated distribution of the main magnetic field and the gradient magnetic field in the anti-eddy current device to obtain the distribution of the gradient magnetic field in the anti-eddy current, and adjusting the setting of the metallic plates of the anti-eddy current device based on the distribution of the gradient magnetic field in the anti-eddy current device, and thus reducing the eddy current.

The adjustment in the setting of the metallic plates of the anti-eddy current device should be such that the gradient magnetic field is parallel to or substantially parallel to the plane of the metallic plates, and thus reducing the generation of the eddy current. Further, the metallic plates can be divided into a number of areas in directions parallel to or substantially parallel to the gradient magnetic field. Said metallic plates may be divided into a number of areas along two directions perpendicular to each other. In addition, the directions of the metallic plates in different areas can also be adjusted according to the specific distribution of the gradient magnetic field to obtain the best effect of eddy current reduction.

BRIEF DESCRIPTION OF THE DRAWINGS

FIG. 5 is a schematic diagram showing the structure of another embodiment of the anti-eddy current device of the present invention used for reducing the eddy current caused by the gradient magnetic field.

FIG. 6 is a schematic diagram of the structure of another embodiment of the anti-eddy current device of the present invention used for reducing the eddy current caused by the gradient magnetic field.

DESCRIPTION OF THE PREFERRED EMBODIMENTS

Figure 1:
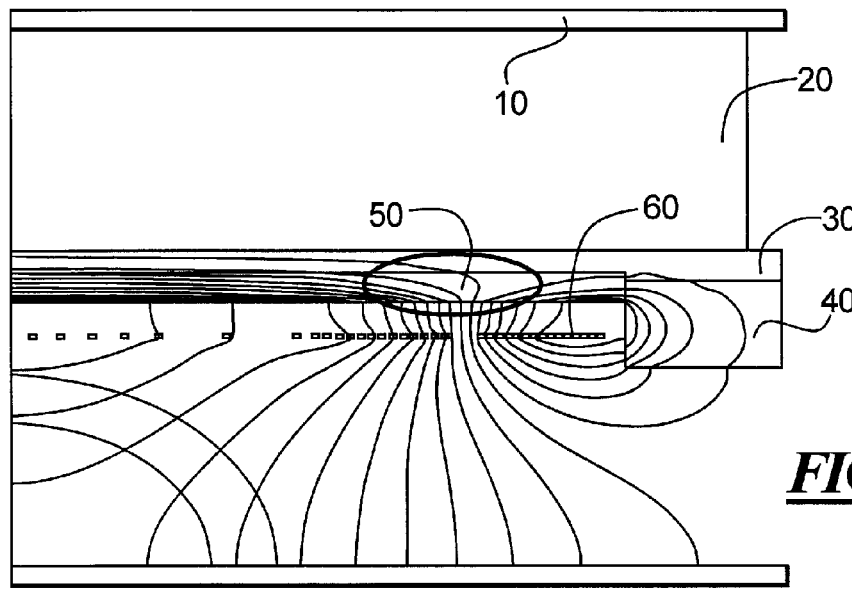
FIG. 1 is a schematic diagram illustrating an anti-eddy current device in an open MRI.

Referring to FIG. 1 and using a conventional open MRI as an example, a magnet 20 is set between pole plates 10 and 30 to generate a main magnetic field. A Rose ring 40 is set under pole plate 30 for shimming and a gradient coil 60 is provided in the magnetic resonance system to generate a gradient magnetic field. An anti-eddy current device 50 is set between pole plate 30 and gradient coil 60 to reduce the eddy current caused by the gradient magnetic field. From FIG. 1 it can be seen that the distribution of the gradient magnetic field is relatively complicated and the pattern of distribution varies from one area to another. The basic concept of the present invention is to adjust the setting of the metallic plates of the anti-eddy current device according to the distribution of the gradient magnetic field, therefore the first step is to obtain the distribution of the gradient magnetic field in the magnetic resonance device, and the next is to adjust the position of the metallic plates (laminations) of the anti-eddy current device so that the characteristics of the plates produce a better result as to eddy current reduction.

Figure 2:
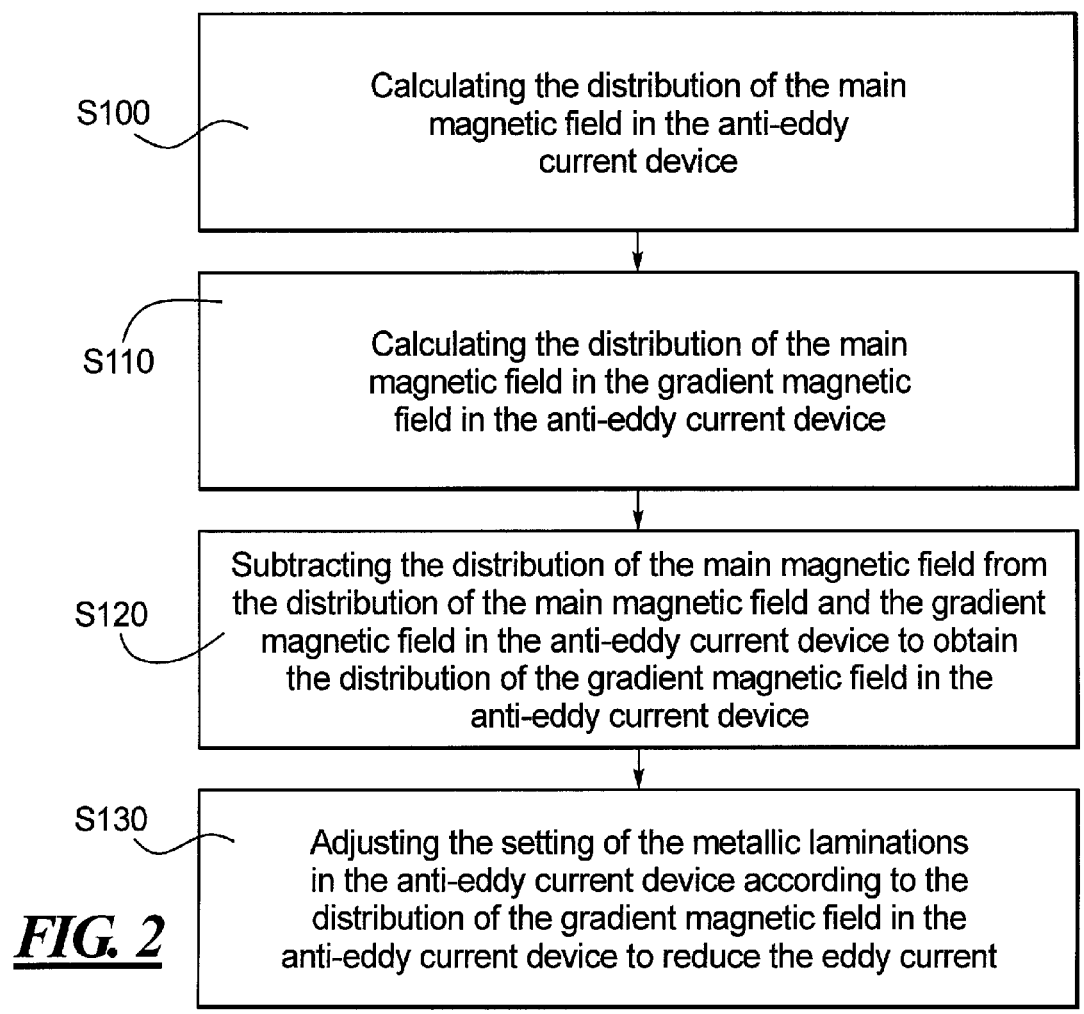
FIG. 2 is a flowchart illustrating embodiment of a method of the present invention for reducing the eddy current caused by the gradient field in an MRI apparatus.

Referring to FIG. 2, the method of the present invention for reducing the eddy current caused by the gradient field includes the following steps all of which are undertaken in an automated, computerized manner:

Step S100: calculating the distribution of the main magnetic field in the anti-eddy current device.

In this step, various magnetic field calculation methods (such as finite elements) can be adopted to calculate the distribution of the main magnetic field in the anti-eddy current device. It should be note that, in this step, only the distribution of the main magnetic field in the anti-eddy current device is considered and the distribution of the gradient magnetic field in the anti-eddy current device is not included in the calculation.

Step S110, calculating the distribution of the main magnetic field and the gradient magnetic field in the anti-eddy current device.

Like the previous step, in this step, various methods for calculating magnetic field can be adopted to calculate the distribution of the main magnetic field and the gradient magnetic field in the anti-eddy current device. The difference from the previous step is that it considers the distribution of both main magnetic field and gradient magnetic field in the anti-eddy current device when the two magnetic fields co-exist.

Step S120: subtracting the distribution of the main magnetic field in the anti-eddy current device derived from step S110 from the distribution of the main magnetic field and the gradient magnetic field in the anti-eddy current device derived from step S100 to obtain the distribution of the gradient magnetic field in the anti-eddy current device.

Step S130: adjusting the setting of the metallic plates of the anti-eddy current device according to the distribution of the gradient magnetic field in the anti-eddy current device to reduce the eddy current.

Figure 3:
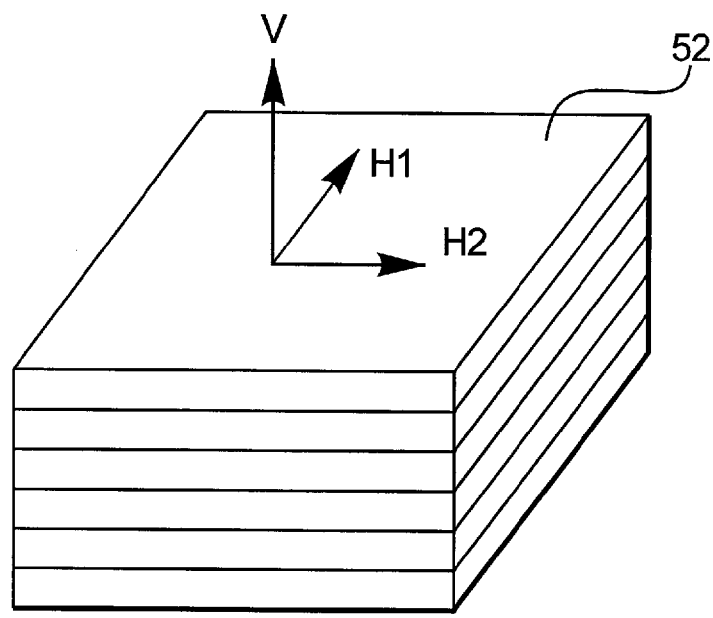
FIG. 3 is a schematic diagram showing the structure of the metallic plates of the anti-eddy current device of the present invention used for reducing the eddy current caused by the gradient magnetic field.

Referring to both FIG. 1 and FIG. 3, anti-eddy current device 50 is formed by at least one, usually a number of mutually insulated metallic plates 52 which are laminated and fixed together. When the metallic plates 52 are placed in the magnetic field, if the changed magnetic field passes vertically through the metallic plates 52 in the direction indicated by arrow V as shown in FIG. 3, the eddy current generated at this time is the largest. If the changed magnetic field passes through the metallic plates 52 in parallel with the plane of the metallic plates 52 along the directions indicated by arrows H1, H2, the eddy current generated at this time will be smallest. Therefore, after obtaining the distribution of the gradient magnetic field of the magnetic resonance system from step S120, the setting of the metallic plates 52 in anti-eddy current device 50 can be adjusted to make the gradient magnetic field of the said magnetic resonance system pass through anti-eddy current device 50 in parallel or substantially in parallel with the plane of the metallic plates 52.

From FIG. 1 it can be seen that the distribution of the gradient magnetic field is relatively complicated and that in order to achieve a better effect in eddy current reduction, the setting of metallic plates 52 should be adjusted according to the specific distributions of the gradient magnetic field in different areas.

Figure 4:
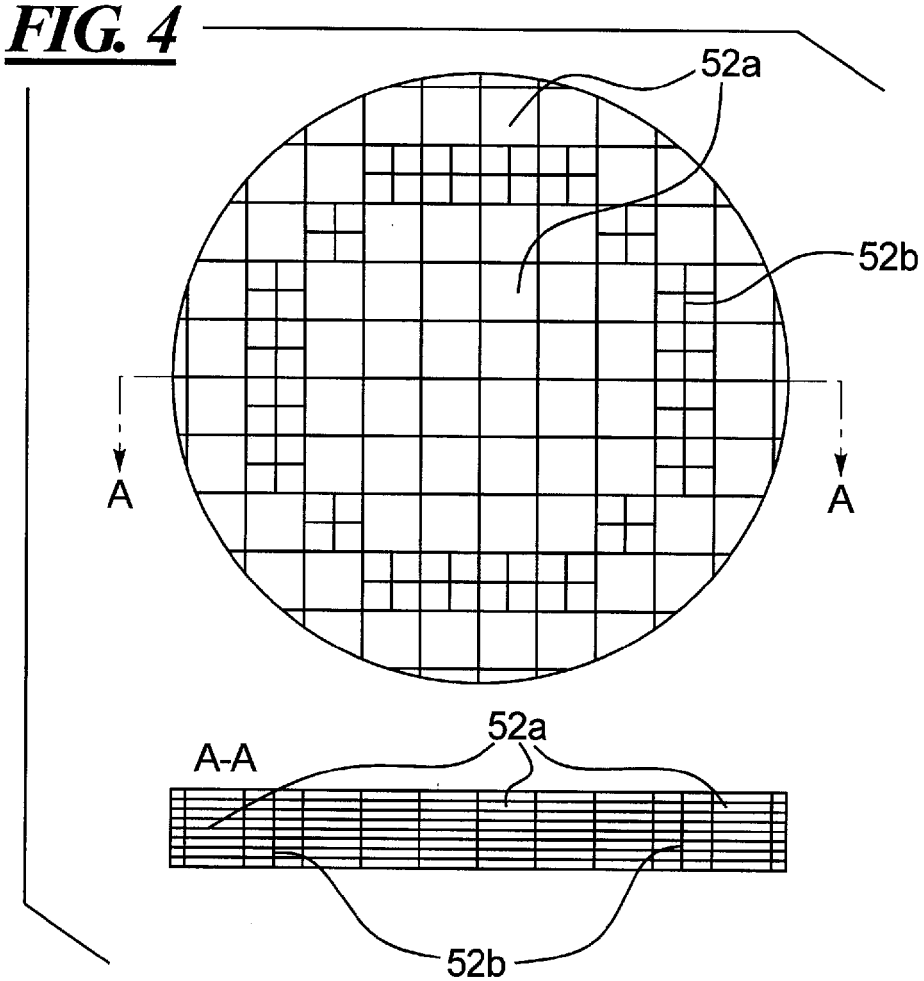
FIG. 4 is a schematic diagram showing the structure of an embodiment of the anti-eddy current device of the present invention used for reducing the eddy current caused by the gradient magnetic field.

FIG. 4 shows an embodiment of the present invention, wherein the upper part is a top view of the anti-eddy current device 50 shown in FIG. 1, the lower part is a sectional view of the device cut in A-A direction. From FIG. 1 it can be seen that the distribution of the magnetic field in the circled area is characterized by the anti-eddy current device 50 is facing one side of the gradient coil 60 and the directions of the majority of the magnetic field are substantially vertical to said anti-eddy current device 50. According to the principle for reducing the eddy current, the metallic plates 52 in the anti-eddy current device 50 are divided along its vertical direction into a number of areas 52a, 52b (52b corresponds to the circled area in FIG. 1) to reduce the path of the eddy current; and in consideration of the magnetic direction at 52b, the metallic plates 52 in its vertical direction at 52b are further divided along two directions, which are perpendicular to each other, to reduce the eddy current.

FIG. 5 shows another embodiment of the present invention, characterized in that the upper part is a top view of the anti-eddy current device 50 shown in FIG. 1, the lower part is a sectional view of the device cut in A-A direction. In this embodiment, the metallic plates 52 in the anti-eddy current device 50 are divided into a number of areas 52c, 52d, wherein the metallic plates 52 in the vertical direction of the anti-eddy current device 50 are divided into a number of areas 52c, thus enabling the gradient magnetic field to pass through the anti-eddy current device 50 in parallel or substantially in parallel with the plane that divides the areas 52c of the metallic plates 52, characterized in that unlike the previous embodiment, this embodiment is characterized in that in areas 52d where there is relatively concentrated distribution of magnetic field, the laminating direction of the metallic plates 52 is vertical to the laminating direction of the metallic plates 52 in areas 52c. This enables the magnetic field in areas 52d, where there is relatively concentrated distribution of the magnetic field, to pass through the anti-eddy current device 50 in parallel or substantially in parallel with the plane of laminating direction of the metallic plates 52.

FIG. 6 shows another embodiment of the present invention, wherein the upper part is a top view of the anti-eddy current device 50 shown in FIG. 1, and the lower part is a sectional view of the device cut in A-A direction. In this embodiment, the metallic plates 52 of anti-eddy current device 50 are divided into a number of areas 52e, 52f; the metallic plates 52 in areas 52e are divided into a number of parts that are distributed in a spoke pattern facing toward the center. The metallic plates 52 in the areas of 52f are distributed in a ring concentrically around said center; furthermore, the metallic plates 52 in areas 52f are also divided into a number of parts that are distributed in a spoke pattern facing toward said center. In this embodiment, in areas 52f where the distribution of the magnetic field is relatively concentrated, the laminating direction of the metallic plates 52 is vertical to that of the metallic plates 52 in areas 52e. This enables the magnetic field in areas 52f where the distribution of the magnetic field is relatively concentrated to pass through the anti-eddy current device 50 in parallel or substantially in parallel with the plane of the laminating direction of the metallic plates 52.

Similarly, the distribution of the gradient magnetic field obtained by using the above said calculation method can be used to adjust the setting of the metallic plates 52 in the anti-eddy current device 50 such that the gradient magnetic field passes through the anti-eddy current device 50 in parallel or substantially in parallel with the laminating plane or dividing plane of metallic plates 52, and avoids passing through said anti-eddy current device 50 perpendicular to the laminating plane or dividing plane of metallic plates 52 to cause a large eddy current.

Although a description of exemplary embodiments of the present invention is provided in combination with drawings, it should be understood that the present invention is not limited to these embodiments and other changes and adaptive modifications made by those of ordinary skill in the art according to the present invention do not depart from the scope and spirit of the present invention.

We claim as our invention:

1. A method for reducing eddy currents caused by a gradient magnetic field in a magnetic resonance system in which a basic magnetic field is generated, said method comprising the steps of:

providing an anti-eddy current device in the magnetic resonance system that reduces eddy currents in the magnetic resonance system caused by the gradient magnetic field, said anti-eddy current device comprising a plurality of settable laminated metallic plates;

automatically electronically calculating a distribution of the basic magnetic field in the anti-eddy current device;

automatically electronically calculating the distribution of the basic magnetic field and the gradient magnetic field in the anti-eddy current device;

automatically electronically subtracting the calculated distribution of the basic magnetic field in the anti-eddy current device from the calculated distribution of the basic magnetic field and the gradient magnetic field in the anti-eddy current device, to obtain a distribution of the gradient magnetic field in the anti-eddy current device; and adjusting a setting of the metallic plates in the anti-eddy current device dependent on the distribution of the gradient magnetic field in the anti-eddy current device to reduce said eddy currents produced in the magnetic resonance system by said gradient magnetic field.

2. A method as claimed in claim 1 comprising adjusting the setting of said metallic plates of said anti-eddy current device to cause said gradient magnetic field to be at least substantially parallel to respective planes of said metallic plates.

3. A method as claimed in claim 2 comprising dividing said metallic plates into a plurality of areas in directions at least substantially parallel to said gradient magnetic field.

4. A method as claimed in claim 3 comprising dividing said metallic plates into said plurality of areas along two directions that are orthogonal to each other.

5. A method as claimed in claim 2 comprising adjusting a laminating direction of said metallic plates in respectively different areas to cause said gradient magnetic field in said anti-eddy current device to be at least substantially parallel to respective planes of said metallic plates.

* * * * *